(12) United States Patent
Kang et al.

(10) Patent No.: US 9,748,117 B2
(45) Date of Patent: Aug. 29, 2017

(54) SUBSTRATE TREATING APPARATUS AND SUBSTRATE TREATING METHOD

(71) Applicant: Semes Co., Ltd., Cheonan-si, Chungcheongnam-do (KR)

(72) Inventors: Unkyu Kang, Cheonan-si (KR); Sungun Kim, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 705 days.

(21) Appl. No.: 13/665,169

(22) Filed: Oct. 31, 2012

(65) Prior Publication Data

US 2013/0108975 A1    May 2, 2013

(30) Foreign Application Priority Data

Oct. 31, 2011   (KR) .................. 10-2011-0111867
Dec. 9, 2011    (KR) .................. 10-2011-0132113

(51) Int. Cl.
*F27D 7/00*      (2006.01)
*H01L 21/67*     (2006.01)

(52) U.S. Cl.
CPC ... *H01L 21/67017* (2013.01); *Y10T 137/8593* (2015.04)

(58) Field of Classification Search
CPC .............................................. H01L 21/67017
USPC ........ 432/65, 249, 250; 137/561 R; 219/390; 118/326
See application file for complete search history.

(56) References Cited

U.S. PATENT DOCUMENTS

| | | | | |
|---|---|---|---|---|
| 4,032,310 A | * | 6/1977 | Ignoffo | F01N 1/24 181/211 |
| 4,537,178 A | * | 8/1985 | Hwang | F24H 3/065 126/110 R |
| 6,354,832 B1 | * | 3/2002 | Yoshimura | H01L 21/67109 118/725 |
| 6,474,986 B2 | * | 11/2002 | Oda | H01L 21/67109 118/724 |
| 6,966,949 B2 | * | 11/2005 | Kobayashi et al. | 118/663 |
| 2004/0206935 A1 | * | 10/2004 | Miura | C09K 11/7702 252/301.4 S |
| 2007/0169373 A1 | * | 7/2007 | Aoki | H01L 21/67109 34/549 |
| 2010/0006025 A1 | * | 1/2010 | Furukawahara | 118/61 |
| 2011/0206585 A1 | * | 8/2011 | Hara | B01D 53/005 423/215.5 |

FOREIGN PATENT DOCUMENTS

| | | |
|---|---|---|
| CN | 101009213 A | 8/2007 |
| CN | 101261456 A | 9/2008 |
| CN | 101652834 A | 2/2010 |
| JP | H10-55951 A | 2/1998 |

(Continued)

*Primary Examiner* — Alissa Tompkins
*Assistant Examiner* — John Bargero
(74) *Attorney, Agent, or Firm* — Harness, Dickey & Pierce P.L.C.

(57) ABSTRACT

Provided is a substrate treating apparatus. The substrate treating apparatus includes a chamber, a support member disposed within the chamber to support a substrate, and an exhaust member for exhausting a gas within an inner space of the chamber to the outside of the chamber. A trap space for collecting fumes contained in the gas is defined in the exhaust member.

15 Claims, 8 Drawing Sheets

(56) References Cited

FOREIGN PATENT DOCUMENTS

| KR | 10-0342070 | 6/2002 |
| KR | 10-0839912 | 6/2008 |
| KR | 10-1048813 | 7/2011 |

* cited by examiner

SUBSTRATE TREATING APPARATUS AND SUBSTRATE TREATING METHOD

CROSS-REFERENCE TO RELATED APPLICATIONS

This U.S. non-provisional patent application claims priority under 35 U.S.C. §119 of Korean Patent Application Nos. 10-2011-0132113, filed on Dec. 9, 2011, and 10-2011-0111867, filed on Oct. 31, 2011, the entire contents of which are hereby incorporated by reference.

BACKGROUND OF THE INVENTION

The present invention disclosed herein relates to a substrate treating apparatus and method, and more particularly, to an apparatus and method for baking a substrate.

To manufacturing semiconductor devices or liquid crystal displays, various processes such as a photolithography process, an etching process, an ion injection process, a cleaning process, and the like are performed. Among these processes, the photolithography process may be performed to form desired patterns on a substrate.

The photolithography process is constituted by a coating process for applying a chemical solution on a substrate, an exposure process for forming a specific pattern on an applied photoresist, and a developing process for removing an unnecessary region on the exposed photoresist which are successively performed.

FIG. 1 is a view of a typical substrate treating apparatus.

Referring to FIG. 1, a substrate treating apparatus 1 includes a housing 2 providing a space in which a baking process is performed, a heater 3 disposed within the housing 2 to heat a substrate S when the baking process is performed, and an exhaust line 4. Fumes generated when the baking process is performed are exhausted to the outside through the exhaust line 4. Also, a gas is introduced through an inlet hole 5 from the outside.

The substrate treating apparatus 1, i.e., a baking apparatus has a central vacuum exhaust structure in which the exhaust line 4 is provided in an upper center of the housing 2. In the central vacuum exhaust structure, since a flow rate of exhaust gas is high, uniformity of a coating thickness on a surface of the substrate S may be reduced. Also, in the central vacuum exhaust structure, defects due to the quick flow rate on the surface of the substrate S may occur, and also, temperature distribution performance of the heater 3 may be deteriorated.

Also, a low-temperature gas may be introduced from the outside to reduce a temperature within a chamber.

Also, in the typical baking apparatus, when the fumes are exhausted through the exhaust line 4, the fumes may be attached to an inner surface of the exhaust line 4 to narrow an exhaust path of the exhaust line 4.

SUMMARY OF THE INVENTION

The present invention provides a substrate treating apparatus in which an exhaust line is not narrowed and a substrate treating method.

The present invention also provides a substrate treating apparatus in which an amount of gas or fume exhausted from a chamber is increased and a substrate treating method.

The present invention also provides a substrate treating apparatus in which a flow rate of a gas is decreased on a surface of a substrate and a substrate treating method.

The present invention also provides a substrate treating apparatus in which a temperature difference between a gas introduced into a chamber and the inside of the chamber is reduced and a substrate treating method.

Embodiments of the present invention provide substrate treating apparatuses including: a chamber; a support member disposed within the chamber to support a substrate; and an exhaust member for exhausting a gas within an inner space of the chamber to the outside of the chamber, wherein a trap space for collecting fumes contained in the gas is defined in the exhaust member.

In other embodiments of the present invention, substrate treating methods include: exhausting a gas within a chamber to the outside of the chamber, wherein an eddy is generated in a space between an upper end of an inner tube having a passage through which the gas in an inner space of the chamber is exhausted and an outer tube disposed outside the chamber to collect fumes contained in the gas into the space.

In still other embodiments of the present invention, substrate treating apparatuses include: a chamber a support member on which a substrate is disposed, the support being disposed within the chamber; a heating member disposed in the support member to transfer heat; an inner tube disposed in an upper portion of the chamber to define a passage through which a gas or fume in an inner space of the chamber is exhausted; and an outer tube disposed outside the chamber to communicate with the inner tube, wherein the gas or fume exhausted from the chamber generates an eddy in a portion at which the inner tube and the outer tube communicate with each other, and the fume is collected between an outer wall of the chamber, the inner tube, and the outer tube.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
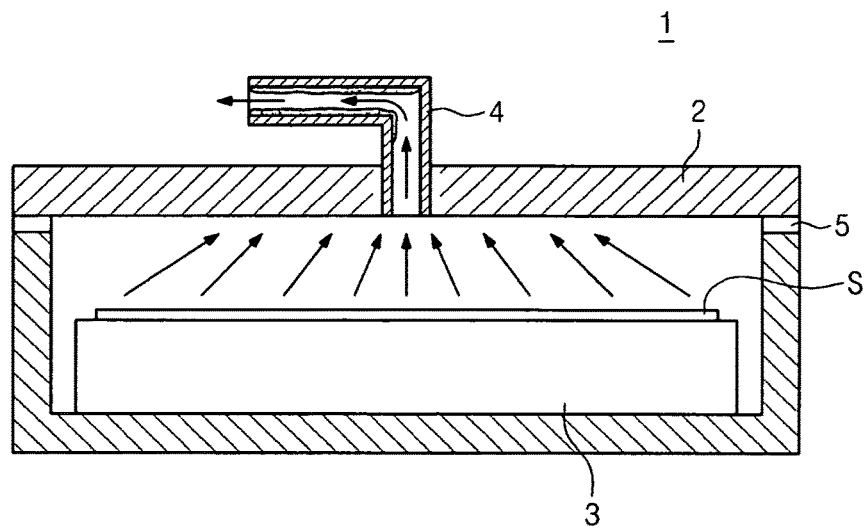
FIG. 1 is a view of a typical substrate treating apparatus.

Hereinafter, exemplary embodiments of the present invention will be described in detail with reference to FIGS. 1 to 7. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

Hereinafter, a case in which a baking process is performed on a substrate will be described as an example. The baking process may be performed before and after a photoresist is applied on the substrate. Also, the baking process may be performed before and after a developing process.

Also, a substrate treating apparatus according to an embodiment of the present invention may be applied to apparatuses for performing a deposition process, an etching process, and a gas supply process except for the apparatus for performing the baking process.

Figure 2:
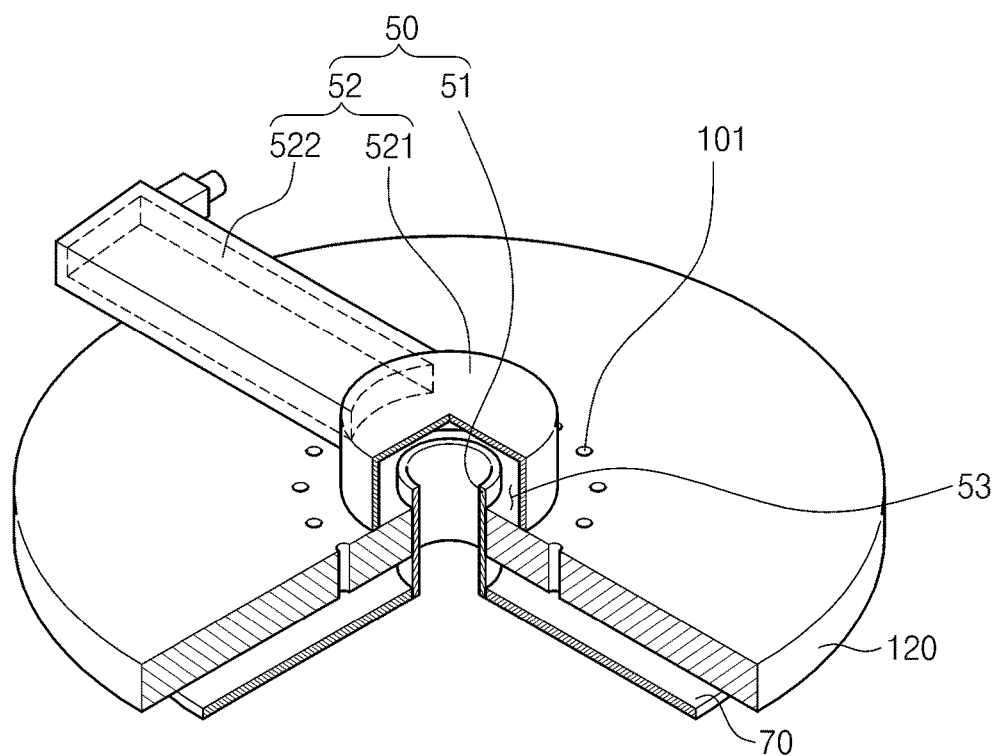
FIG. 2 is a partial cut-way perspective view of a substrate treating apparatus according to the present invention.
Figure 3:
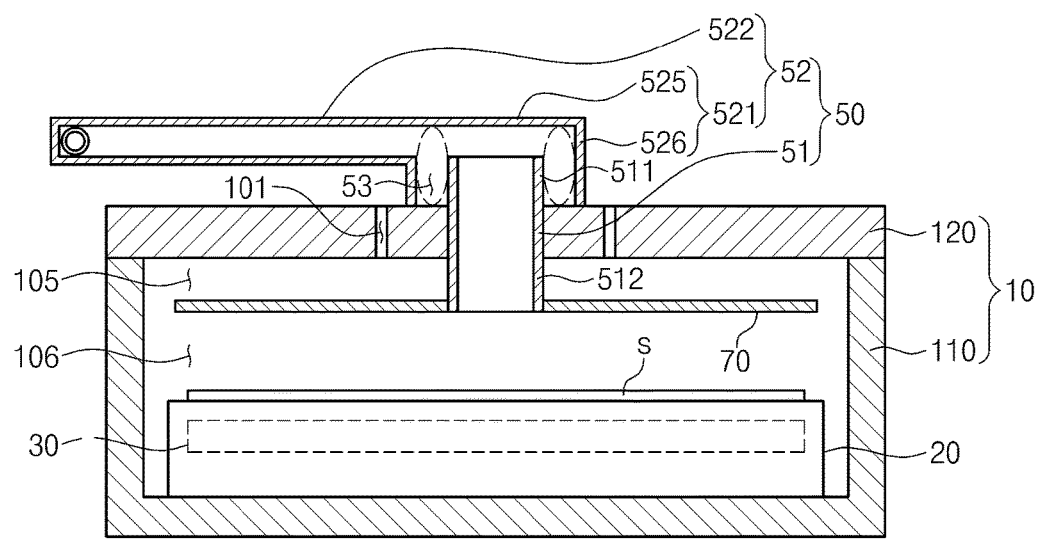
FIG. 3 is a cross-sectional view of a substrate treating apparatus according to an embodiment of the present invention.

FIG. 2 is a partial cut-way perspective view of a substrate treating apparatus according to an embodiment of the present invention. FIG. 3 is a cross-sectional view of a substrate treating apparatus according to an embodiment of the present invention.

Referring to FIGS. 2 and 3, a substrate treating apparatus includes a chamber 10, a support member 20, an exhaust member 50, and a guide member 70.

The chamber 10 provides an inner space in which a substrate is treated. The chamber 10 has a shape corresponding to that of the substrate to be treated in the substrate treating apparatus. Thus, in a case where the substrate is treated for manufacturing a semiconductor device, the chamber 10 has a cylindrical shape. Also, in a case where the substrate is treated for manufacturing a liquid crystal display, the chamber 10 may have a hexahedral shape. Hereinafter, the case in which the substrate is treated for manufacturing the semiconductor device will be described as an example. However, the present invention may be applied to the case in which the substrate is treated for manufacturing the liquid crystal display.

The chamber 10 includes a first body 110 and a second body 120. The first body 110 may have a cylindrical shape with an opened upper side. Also, the second body 120 may have a cylindrical shape with an opened lower side or a circular plate shape which corresponds to that of the opened upper side of the first body 110. When the second body 120 is disposed on the opened upper side of the first body 110, an inner space defined by the first body 110 and the second body 120 may be sealed. The substrate is loaded into the chamber 10 in a state where the second body 120 is separated from the first body, and then, the second body 120 is disposed on the upper side of the first body 110.

The support member 20 is disposed in the inner space of the chamber 10. The support member 20 has an area greater than that of the substrate when viewed from an upper side. The support member 20 has a circular plate shape and is fixed to the first body 110. The substrate loaded into the chamber 10 is disposed on the support member 20.

A first heating member 30 is disposed in the support member 20. The first heating member 30 is heat-exchanged with the support member 20. The first heating member 30 may be disposed in the support member 20 or contact a bottom surface of the support member 20. When the first heating member 30 is operated, heat generated in the first heating member 30 is conducted into the substrate to heat the substrate.

The exhaust member 50 includes an inner tube 51 and an outer tube 52. The exhaust member 50 may be disposed in an upper portion or a side surface of the chamber 10. The inner tube 51 is disposed to cross the first or second body 110 or 120. That is, in the inner tube 51, a first end 511 disposed in a side of an outer wall of the chamber 10 protrudes from the outer wall of the chamber 10, and a second end 512 disposed in a side of an inner wall of the chamber 10 protrudes from the inner wall of the chamber 10.

The outer tube 52 contacts the outer well of the chamber 10 while surrounding the first end 511. The outer tube 52 is provided separated from the chamber 10 and is detachably disposed on an outer surface of the chamber. The outer tube 52 includes a connection part 521 and an extension part 522. The connection part 521 has a hole having a size greater than that of a sectional area of the inner tube 51. The connection part 521 includes a sidewall and an upper wall. The connection part 521 has the sidewall extending in the same direction as an extending direction of the inner tube 51, and the upper wall is spaced from the first end 511. Thus, trap spaces 53 are defined between the first end 511, the connection part 521, and the outer wall of the chamber 10. The extension part 522 extends in a direction different from an extension direction of the connection part 521. For example, the extension part 522 may extend in a direction perpendicular to the extension direction of the connection part 521. The extension part 522 extends and has a hole corresponding to the hole in a portion of the sidewall.

When the exhaust member 50 is disposed on an upper end of the chamber 10, the guide member 70 is disposed on the second end 512. Thus, trap spaces 512 are defined between the first end 51, the connection part 2, and the outer wall of the chamber 10. The guide member 70 is disposed spaced from inner walls of top and side surfaces of the chamber 10. Thus, an upper space 105 defined above the guide member 70 and a lower space 106 defined under the guide member 70 are defined within the chamber 10. When viewed from an upper side, the guide member 70 may have an area greater than that of the substrate disposed on the support member 20. Also, the guide member 70 may be integrated with the inner tube 51 or be separately provided and then fixed to the second end 512 of the inner tube 51. The guide member 70 has a hole corresponding to that defined in the inner tube 51. Thus, gas within the chamber 10 is exhausted through the guide member 70 and the inner tube 51.

An inlet hole 101 is defined in an upper portion of the chamber 10. The inlet hole 101 is defined outside a position at which the chamber 10 contacts the outer tube 52. Thus, gas outside the chamber 10 may be introduced into the chamber 10.

Figure 4:
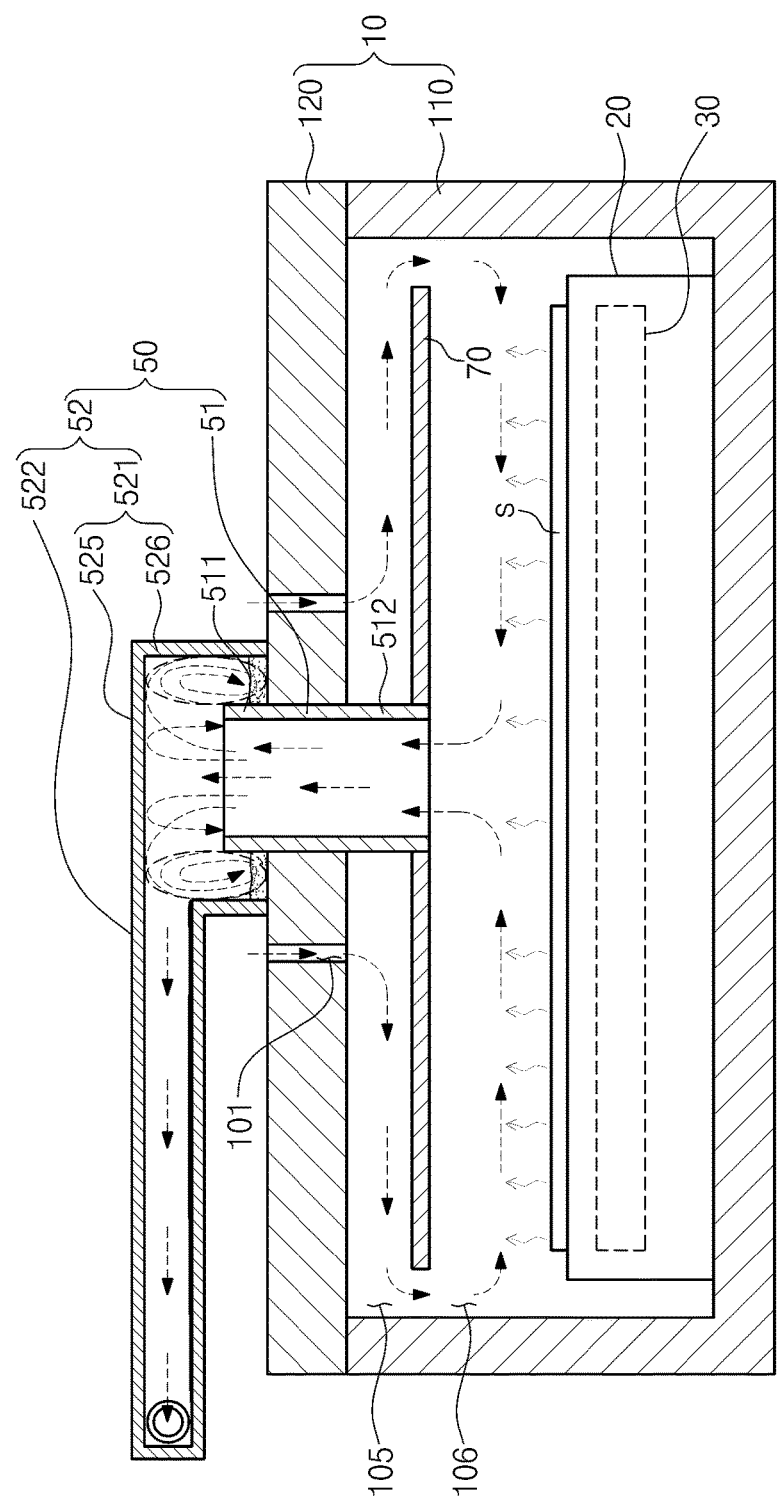
FIG. 4 is a view illustrating a flow of a gas.

FIG. 4 is a view illustrating a flow of a gas.

Referring to FIG. 4, a flow of a gas exhausted from the inside of the chamber 10 to the outside of the chamber 10 will be described. Also, a flow of a gas introduced from the outside of the chamber 10 to the inside of the chamber 10 will be described.

A gas receiving heat conducted from the heated substrate flows upward. Also, when the substrate is heated, fumes are evaporated from the substrate. The fumes are contained in the gas to flow together. The upwardly flowing gas flows toward the inner tube 51 in which a hole is defined to have a low pressure.

When the gas reaches the first end 511 of the inner tube 51, an eddy is generated in the trap space 53. That is, a gas flow generated through the inner tube 51 is blocked by the upper wall. Also, the first end 511 and the sidewall are spaced from each other to define a space. Thus, the gas discharged from the inner tube 51 occurs an eddy while flowing along the upper wall and the inner wall. When the gas occurs the eddy, the fumes contained in the gas are reduced in energy while colliding with the upper wall or the inner wall. Also, the fumes may collide with each other to cohere with each other, thereby increasing a volume of a fume particle. Thus, the fumes are separated from the gas and then accumulated in the trap space 53. The gas from which the fumes are separated flows into the extension part and then is exhausted to the outside. When a predetermined amount of fumes is accumulated in the trap space 53, the outer tube 52 is separated from the chamber 10, and then, the fumes may be removed.

A gas introduced into the inlet hole 101 flows into a space defined between the inner wall of the top surface of the chamber 10 and the guide member 70 to flow downward from the inner wall of the side surface of the chamber 10. Since the inside of the inner tube 51 has a low pressure, a flow of the gas introduced into the inlet hole 101 is guided by the guide member 70 to flow into the inner tube 51. Also, the gas heated above the substrate flows upward to contact the gas introduced into the inlet hole 101 and flow into the inner tube 51. Thus, an amount of gas exhausted from the chamber 10 is increased by the same amount of gas introduced into the inlet hole 101 to increase an amount of exhausted fumes contained in the gas.

Also, the guide member 70 may have an area greater than that of the substrate when viewed from an upper side. Thus, the gas flowing upward above the substrate contacts the gas introduced into the inlet hole 101 to flows into the inner tube 51. Thus, the gas flowing upward above the substrate flows in direction perpendicular to that of the substrate to flow together with the gas introduced into the inlet hole 101. Thus, an amount of gas flowing in a direction parallel to that of a top surface of the substrate is decreased on the top surface of the substrate to reduce a flow rate on the surface of the substrate. The inner tube 51 may be vertically movable to adjust a distance between the substrate and the guide member 70. Thus, even though an amount of gas flowing upward above the substrate is changed, the guide member may be adjusted in position so that an amount of gas flowing in the direction parallel to that of the top surface of the substrate is not changed.

Also, the guide member 70 may be formed of a conductive material. Thus, the gas introduced into the inlet hole 101 may be heated while flowing into the upper space 105. Thus, a temperature difference between the gas flowing downward into the lower space 106 and the gas within the lower space 106 is reduced to prevent defects of the substrate due to a temperature change within the chamber 10 from occurring.

Figure 5:
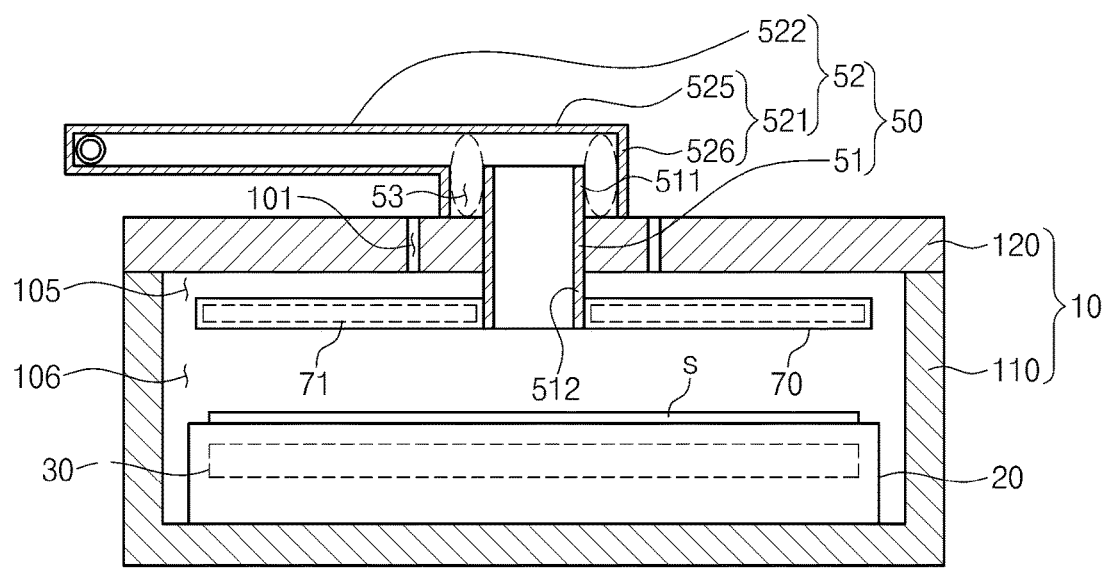
FIG. 5 is a cross-sectional view of a substrate treating apparatus according to another embodiment of the present invention.

FIG. 5 is a cross-sectional view of a substrate treating apparatus according to another embodiment of the present invention.

Referring to FIG. 5, a second heating member 71 is disposed in a guide member 70. The second heating member 71 may be disposed in the guide member 70 or contact an outer surface of the guide member 70. The second heating member 71 is controlled in temperature so that a temperature difference between a gas introduced into an inlet hole 101 and a gas above a substrate is reduced. Thus, when the second heating member 71 is provided, a temperature within a chamber 10 may be uniformly maintained.

Figure 6:
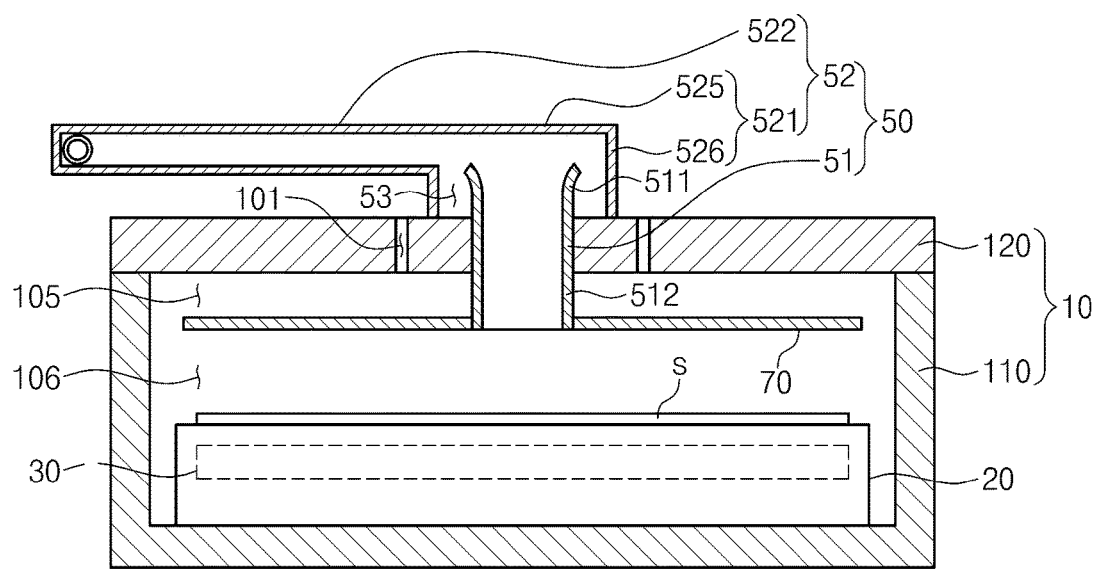
FIG. 6 is a cross-sectional view of a substrate treating apparatus according to another embodiment of the present invention.

FIG. 6 is a cross-sectional view of a substrate treating apparatus according to another embodiment of the present invention.

Referring to FIG. 6, a first end 511 is rounded toward an outer surface thereof. The first end 511 may be rounded in a direction in which a gas flowing into an inner tube 51 generates an eddy in a trap space 53. Thus, the eddy of gas generated in the trap space 53 is increased in flow rate. Thus, fumes contained in the gas may more frequently collide with an upper wall or an inner wall. Also, the fumes may more frequently collide with each other. Thus, fumes contained in the gas may be effectively removed.

Figure 7:
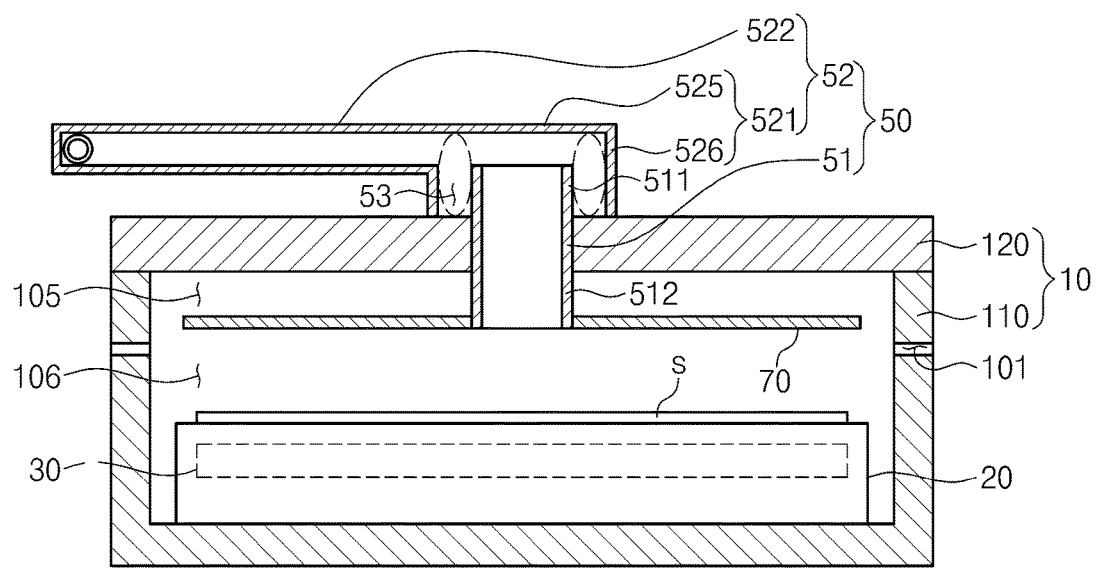
FIG. 7 is a cross-sectional view of a substrate treating apparatus according to another embodiment of the present invention.

FIG. 7 is a cross-sectional view of a substrate treating apparatus according to another embodiment of the present invention.

Referring to FIG. 7, an inlet hole 101 may be defined in a side surface of a chamber 10. The inlet hole 101 is defined in a position at which a gas introduced into the inlet hole 101 flows onto a bottom surface of a guide member 70. Thus, the gas introduced into the inlet hole 101 contacts a gas flowing upward from a substrate to flow into a hole defined in an inner tube 51.

Figure 8:
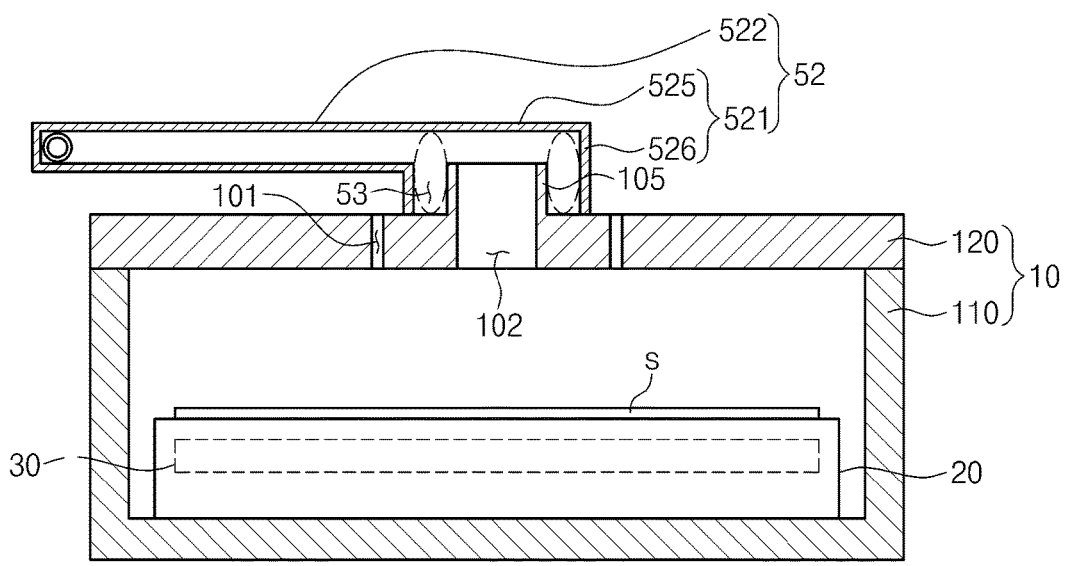
FIG. 8 is a cross-sectional view of a substrate treating apparatus according to another embodiment of the present invention.

FIG. 8 is a cross-sectional view of a substrate treating apparatus according to another embodiment of the present invention.

Referring to FIG. 8, an outlet hole 102 is defined in a chamber 10. Also, a protrusion 105 is disposed on an outer surface of the chamber 10 to correspond to an inlet hole 102. Thus, a trap space 53 is defined between the protrusion 105, a connection part 521, and an outer wall of the chamber 10.

According to the present invention, the fumes contained in the gas exhausted from the chamber may be collected to prevent the exhaust path of the exhaust member from being narrowed by the attachment of the fumes to the exhaust member.

Also, an amount of gas or fume exhausted from the chamber may be increased to prevent the defects of the substrate surface from occurring.

Also, the flow rate on the substrate surface may be reduced to prevent the defects of the substrate surface from occurring.

A temperature difference between the gas introduced into the chamber and the inside of the chamber may be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising: a chamber having at least a top surface;
   a support member within the chamber configured to support a substrate;
   an exhaust member configured to exhaust a gas within an inner space of the chamber to an outside of the chamber, the exhaust member having an inner tube and an outer tube, the inner tube including a first end and a second end, the outer tube being detachably connected to the top surface of the chamber while when fumes contained in a gas are removed, the first end of the inner tube extending from the top surface of the chamber a lesser length than the outer tube extends from the top surface of the chamber such that the outer tube surrounds the inner tube with a trap space therebetween along the top surface of the chamber to collect the fumes;
   and a guide member, the guide member being a disc having a hollow center such that the second end of the inner tube passes through the hollow center of the guide member and suspends the guide member therefrom within the chamber, a diameter of the guide member being less than a diameter of the chamber and larger than a diameter of the substrate such that the gas flows about a top surface and a bottom surface of the guide member, then through the second end of inner tube penetrating the hollow center of the guide member, then through the outer tube to the outside while the fumes contained in the gas are collected in the trap space along the ton surface of the chamber between the first end of the inner tube and the outer tube.

2. The substrate treating apparatus of claim 1, further comprising: a heating member in the support member configured to transfer heat.

3. The substrate treating apparatus of claim 1, wherein the outer tube comprises a connection part surrounding the first end and an extension part extending from the connection part in a direction different from a length direction of the connection part.

4. The substrate treating apparatus of claim 3, wherein the different direction is a direction perpendicular to the length direction of the connection part.

5. The substrate treating apparatus of claim 1, wherein the first end of the inner tube is flanged toward an outer surface thereof to increase a flow rate of the gas into the inner tube.

6. The substrate treating apparatus of claim 1, wherein the inner tube is in an upper portion of the chamber.

7. The substrate treating apparatus of claim 6, wherein the top surface of the chamber includes a plurality of inlet holes in a circular pattern surrounding the exhaust member through which the gas is introduced in the chamber such that the gas flows about the top surface and the bottom surface of the guide member.

8. The substrate treating apparatus of claim 7, wherein the plurality of inlet holes are defined outside a position at which the chamber contacts the outer tube.

9. The substrate treating apparatus of claim 7, wherein the second end of the inner tube inside the chamber protrudes from an inner wall of the chamber, and
the guide member extending an outer surface of the inner tube toward the inner wall of the chamber is on the second end.

10. The substrate treating apparatus of claim 9, wherein the guide member is spaced from the inner walls of top and side surfaces of the chamber.

11. The substrate treating apparatus of claim 9, wherein a heating member is in the guide member.

12. The substrate treating apparatus of claim 9, wherein the guide member is vertically movable relative to the chamber to adjust a distance between the substrate and the guide member.

13. The substrate treating apparatus of claim 1, wherein a heating member is in the support member to transfer heat.

14. A substrate treating method using a substrate treating apparatus including a chamber, a support member, an exhaust member and a guide member, the support member being within the chamber configured to support a substrate, the exhaust member configured to exhaust a gas within an inner space of the chamber to an outside of the chamber, the exhaust member having an inner tube and an outer tube, the inner tube including a first end and a second end, the outer tube being detachably connected to a to surface of the chamber when fumes contained in a gas are removed, the first end of the inner tube extending from the top surface of the chamber a lesser length than the outer tube extends from the top surface of the chamber such that the outer tube surrounds the inner tube with a trap space therebetween along the top surface of the chamber to collect the fumes, and the guide member being a disc having a hollow center such that the second end of the inner tube passes through the hollow center of the guide member and suspends the guide member therefrom within the chamber, the method comprising: introducing a gas into a plurality of inlet holes in the top surface; guiding a flow of the gas inside the chamber via the guide member, a diameter of the guide member being less than a diameter of the chamber and larger than a diameter of the substrate such that the gas flows about a top surface and a bottom surface of the guide member and then through the second end of the inner tube penetrating the hollow center of the guide member up and out the first end of the inner tube into the outer tube; collecting fumes contained in the gas by generating an eddy in the trap space along the top surface of the chamber between the first end of the inner tube and the outer tube; and exhausting, via the exhaust member, the gas within the chamber to the outside of the chamber.

15. The substrate treating method of claim 14, wherein the guide member is configured to guide a flow of the gas introduced into the plurality of inlet holes in a circular pattern surrounding the exhaust member such that the gas flows about the top surface and the bottom surface of the guide member.

* * * * *